United States Patent
Choi et al.

(10) Patent No.: US 8,022,622 B2
(45) Date of Patent: Sep. 20, 2011

(54) ORGANIC LIGHT-EMITTING DISPLAY DEVICE INCLUDING A PHOTO DIODE

(75) Inventors: Dae Chul Choi, Seoul (KR); Byoung Deog Choi, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1027 days.

(21) Appl. No.: 11/683,775

(22) Filed: Mar. 8, 2007

(65) Prior Publication Data
US 2007/0273291 A1   Nov. 29, 2007

(30) Foreign Application Priority Data

Mar. 29, 2006 (KR) .................. 10-2006-0028573

(51) Int. Cl.
*H01L 51/50* (2006.01)
*H01L 51/52* (2006.01)
(52) U.S. Cl. ...................... 313/507; 313/506
(58) Field of Classification Search .............. None
See application file for complete search history.

(56) References Cited

U.S. PATENT DOCUMENTS

| | | | | |
|---|---|---|---|---|
| 5,886,374 A | * | 3/1999 | Sakamoto et al. | 257/292 |
| 2001/0028060 A1 | * | 10/2001 | Yamazaki et al. | 257/72 |
| 2005/0136784 A1 | * | 6/2005 | Seo et al. | 445/24 |
| 2006/0076887 A1 | * | 4/2006 | Kang | 313/512 |
| 2007/0241998 A1 | * | 10/2007 | Fish et al. | 345/76 |

FOREIGN PATENT DOCUMENTS

| | | |
|---|---|---|
| KR | 10-2005-0002606 | 1/2005 |
| KR | 10-2005-0092816 | 9/2005 |
| KR | 10-2005-0108903 | 11/2005 |
| KR | 10-2006-0010911 | 2/2006 |
| KR | 10-2006-0010912 | 2/2006 |

OTHER PUBLICATIONS

Korean Patent Abstract, Publication No. 1020050092816 A; dated Sep. 23, 2005 in the name of Min Ah, et al.
Korean Patent Abstracts, Publication No. 1020050002606 A; Date of Publication: Jan. 7, 2005; in the name of Ryuji Nishikawa et al.

(Continued)

*Primary Examiner* — Toan Ton
*Assistant Examiner* — Britt D Hanley
(74) *Attorney, Agent, or Firm* — Christie, Parker & Hale, LLP

(57) ABSTRACT

An organic light emitting display device including: a substrate having a pixel region and a non-pixel region; a first buffer layer and a second buffer layer formed over the substrate; a thin film transistor formed over the second buffer layer; an organic light emitting device formed in the pixel region and electrically connected with the thin film transistor; and a photo diode formed in the non-pixel region, for receiving external light of red wavelength at a certain absorption rate, and for controlling brightness of the organic light emitting device. Here, the first buffer layer can be formed to be from 2900 Å to 3100 Å in thickness, the second buffer layer can be formed to be from 200 Å to 400 Å in thickness, and the photo diode can include: an N-type doping region, a channel region being from 3 to 10 μm in width, and a P-type doping region.

18 Claims, 7 Drawing Sheets

OTHER PUBLICATIONS

Korean Patent Abstracts, Publication No. 1020060010911 A; Date of Publication: Feb. 3, 2006; in the name of Jae Sung Lee, et al.
Korean Patent Abstracts, Publication No. 1020060010912 A; Date of Publication: Feb. 3, 2006; in the name of Jae Sung Lee.
Notice of Allowance dated Aug. 29, 2007 for corresponding Korean Patent Application No. 10-2006-0028573.
Korean Patent Abstracts, Publication No. 1020050108903 A; Publication Date: Nov. 17, 2005; in the name of Min.

* cited by examiner

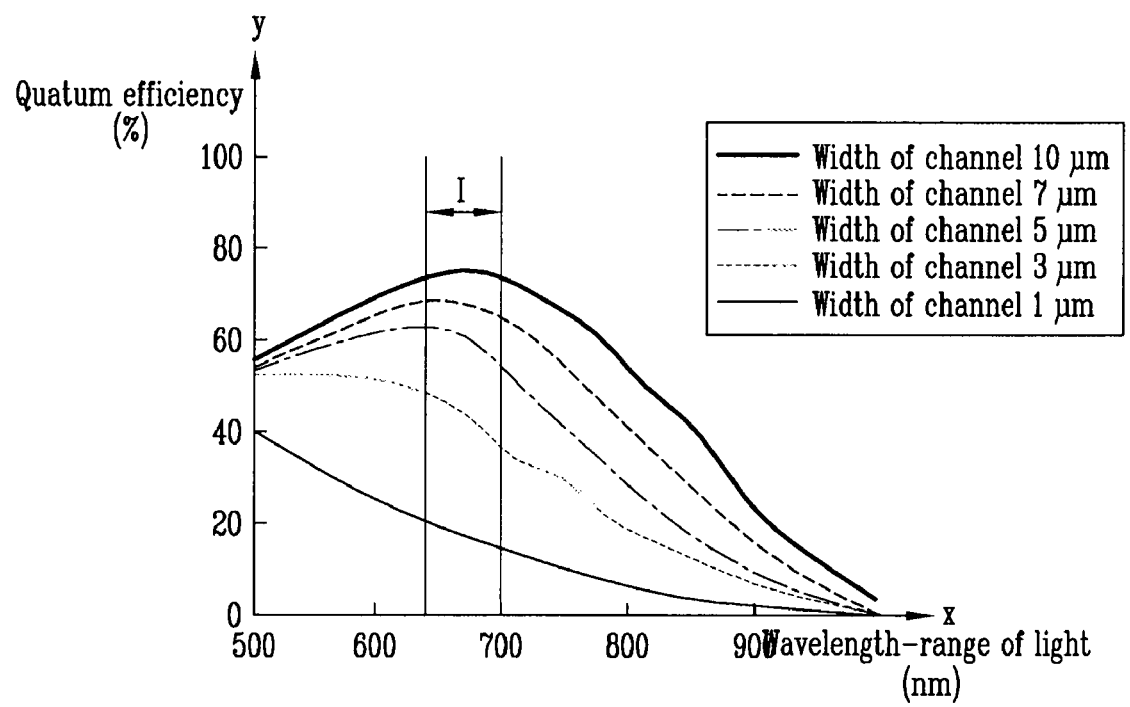

ORGANIC LIGHT-EMITTING DISPLAY DEVICE INCLUDING A PHOTO DIODE

CROSS-REFERENCE TO RELATED APPLICATION

This application claims priority to and the benefit of Korean Patent Application No. 10-2006-0028573, filed on Mar. 29, 2006, in the Korean Intellectual Property Office, the entire content of which is incorporated herein by reference.

BACKGROUND

1. Field of the Invention

The present invention relates to an organic light emitting display device, which includes a photo diode for receiving light of red wavelength incident from an external source to a non-pixel region, and for controlling brightness of an organic light emitting device.

2. Discussion of Related Art

In general, an organic light emitting device includes: a pair of electrodes having an anode electrode and a cathode electrode, and a light emitting layer. In more detail, the organic light emitting device can include: a hole injecting layer, a hole transporting layer, an electron injecting layer and an electron transporting layer. Such an organic light emitting device can emit light because of the following light emitting principle. Positive charge carries or holes are injected into a hole injecting layer from an anode electrode, and the holes injected into the hole injecting layer are transported to a light emitting layer by a hole transporting layer. Further, negative charge carriers or electrons are injected into an electron injecting layer from a cathode electrode, and the electrons injected from the electron injecting layer are transported to the light emitting layer by an electron transporting layer. The holes and the electrons that are transported to the light emitting layer are then coupled with each other to form excitons, thereby light-emitting the light emitting layer.

Hereinafter, a conventional organic light emitting device will be described in more detail with reference FIG. 1.

FIG. 1 is a cross-sectional view of a conventional organic light emitting diode.

Referring to FIG. 1, an organic light emitting diode 10 includes a buffer layer 110 on a substrate 100. A thin film transistor 120 is formed over the buffer layer 110. The thin film transistor 120 includes: a semiconductor layer 121, a gate electrode 122, and source and drain electrodes 123. A planarization layer 130 is formed over the thin film transistor 120, a first electrode layer 140 electrically connected with the source or drain electrode 123 is formed over the planarization layer 130, and a pixel defined layer 150 is formed over the first electrode layer 140. The pixel defined layer 150 includes an opening part for at least partially exposing the first electrode layer 140. A light emitting layer 160 is formed over the opening part. A second electrode layer 170 is formed over the light emitting layer 160. Besides, one or more of an electron injecting layer, an electron transporting layer, a hole transporting layer and a hole injecting layer can be formed between the first electrode layer 140 and the second electrode layer 170.

In the above organic light emitting diode, the organic material, which is the light emitting layer 160 of the organic light emitting diode, may be deteriorated to change the brightness of pixel, as time passes, resulting in that the image quality or brightness of a display is displayed in values different from the expected values. Accordingly, the organic light emitting diode does not have a long lifespan.

In order to solve the above problems, an approach of forming a photo diode in the organic light emitting diode is proposed. This approach allows for a constant brightness to be represented for an input signal regardless of the deterioration of the organic light emitting device by using the photo diode to convert light energy received by (or incident on) the photo diode into an electric signal.

However, the aforesaid photo diode has a relatively low light receiving rate (less than 50% according to a wavelength of light), and there is a limit to its control of the brightness of the organic light emitting device.

SUMMARY OF THE INVENTION

An aspect of the present invention provides an organic light emitting display device, which includes a photo diode for receiving light of red wavelength incident from an external source to a non-pixel region, and for controlling brightness of the organic light emitting device. Here, the organic light emitting diode increases quantum efficiency of the photo diode by using a thickness of a buffer layer formed in the lower part of the photo diode and a width of a channel (or channel region) of the photo diode.

In an embodiment of the present invention, an organic light emitting display device includes: a substrate having a pixel region and a non-pixel region; a first buffer layer and a second buffer layer formed over the substrate; a thin film transistor formed over the second buffer layer; an organic light emitting device formed in the pixel region and electrically connected with the thin film transistor; and a photo diode formed in the non-pixel region and for receiving external light of red wavelength at a certain absorption rate, wherein the first buffer layer is formed to be from 2900 Å to 3100 Å in thickness, the second buffer layer is formed to be from 200 Å to 400 Å in thickness, and the photo diode includes: an N-type doping region, a channel region being from 3 to 10 μm in width, and a P-type doping region.

In one embodiment, the photo diode is formed in the non-pixel region and over the second buffer layer, and wherein the photo diode is spaced apart from the thin film transistor, the first buffer layer is made of a silicon oxide film, and/or the second buffer layer is made of a silicon nitride film.

According to another embodiment of the present invention, there is provided an organic light emitting display device including: a substrate having a pixel region and a non-pixel region; a first buffer layer and a second buffer layer formed over the substrate; a thin film transistor formed over the second buffer layer; an organic light emitting device formed in the pixel region and electrically connected with the thin film transistor; and a photo diode formed in the non-pixel region and for receiving external light of red wavelength at a certain absorption rate, wherein the first buffer layer is formed to be from 700 Å to 900 Å in thickness, the second buffer layer is formed to be from 100 Å to 300 Å in thickness, and the photo diode includes: an N-type doping region, a channel region being from 4 to 10 μm in width, and a P-type doping region.

According to yet another embodiment of the present invention, there is provided an organic light emitting display device including: a substrate having a pixel region and a non-pixel region; a first buffer layer and a second buffer layer formed over the substrate; a thin film transistor formed over the second buffer layer; an organic light emitting device formed in the pixel region and electrically connected with the thin film transistor; and a photo diode formed in the non-pixel region and for receiving external light of red wavelength at a certain absorption rate, wherein the first buffer layer is formed to be from 700 Å to 900 Å in thickness, the second buffer layer is formed to be from 300 Å to 500 Å in thickness, and the photo diode includes: an N-type doping region, a channel region being from 5 μm to 10 μm in width, and a P-type doping region.

BRIEF DESCRIPTION OF THE DRAWINGS

The accompanying drawings, together with the specification, illustrate exemplary embodiments of the present invention, and, together with the description, serve to explain the principles of the present invention.

FIG. 7 is a graph showing quantum efficiency of a photo diode receiving external light of red wavelength according to a third embodiment of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 1:
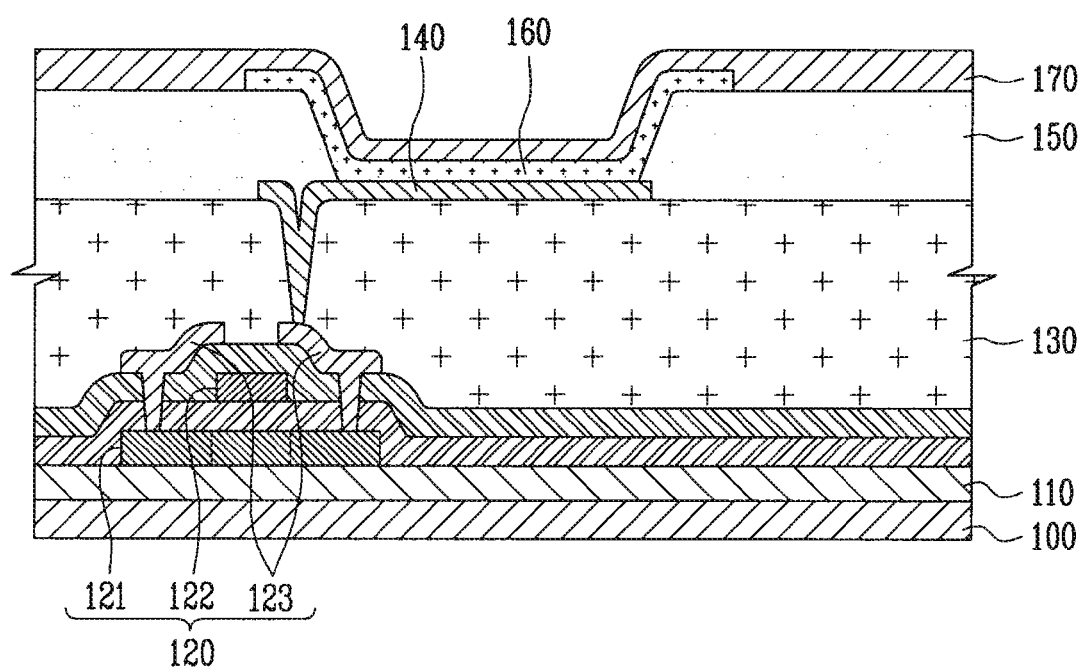
FIG. 1 is a cross-sectional view of a conventional organic light emitting diode.
Figure 2:
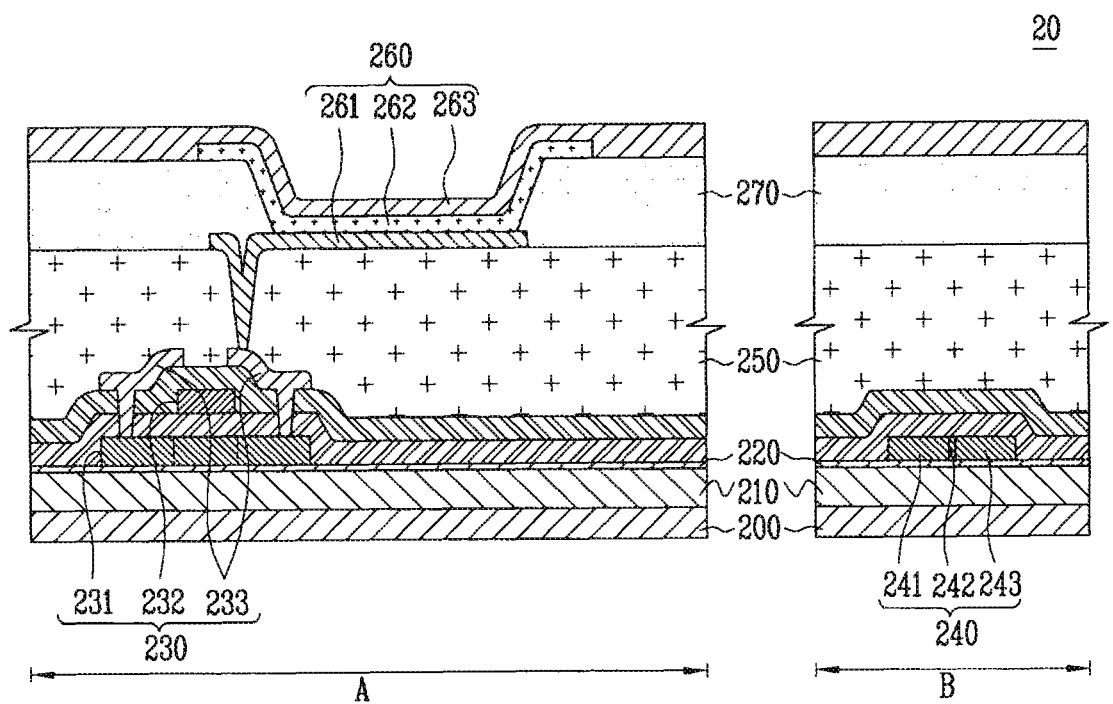
FIG. 2 is a cross-sectional view of an organic light emitting diode having a photo diode according to a first embodiment of the present invention.

FIG. 2 is a cross-sectional view of an organic light emitting diode having a photo diode according to a first embodiment of the present invention.

Referring to FIG. 2, an organic light emitting diode 20 according to the present invention includes: a substrate 200 having a pixel region A and a non-pixel region B; a first buffer layer 210 and a second buffer layer 220 formed over the substrate 200; a thin film transistor 230 formed over the second buffer layer 220; an organic light emitting device 260 formed in the pixel region A of the substrate 200 and electrically connected with the thin film transistor 230; and a photo diode 240 formed in the non-pixel region B and for receiving external light of red wavelength at a certain or predetermined absorption rate, wherein the first buffer layer 210 is formed to be from 2900 Å to 3100 Å in thickness, the second buffer layer 220 is formed to be from 200 Å to 400 Å in thickness, and the photo diode 240 includes an N-type doping region 241, a channel region 242 being from 3 to 10 μm in width, and a P-type doping region 243.

Although the substrate 200 can be made of an insulated material, such as glass, plastic, silicon or synthetic resin, in one embodiment, a transparent substrate, such as a glass substrate, is used. In one embodiment, the pixel region A is the region displaying an image, and the non-pixel region B is all the regions other than the pixel region A of the substrate 200. Also, the thin film transistor 230 can be formed in the pixel region A.

The first buffer layer 210 is formed over the substrate 200. The first buffer layer 210 is made of a silicon oxide film $SiO_2$ and is formed to be from 2900 Å to 3100 Å in thickness, and, in one embodiment, it is formed to be 3000 Å in thickness. The second buffer layer 220 is made of a silicon nitride film SiNx and is formed to be from 200 Å to 400 Å in thickness, and, in one embodiment, it is formed to be 300 Å in thickness. The thickness of the first buffer layer 210 and the thickness of the second buffer layer 220 are formed to have the above thickness ranges because these thickness ranges allow the photo diode 240 to receive the external light of red wavelength at a light receiving rate in a range from 50% to 90% or more. Here, the first buffer layer 210 and the second buffer layer 220 also reduce or prevent the diffusion of impurities while the thin film transistor 230 and the photo diode 240 are being formed to be post-processed.

The thin film transistor 230 is formed on the second buffer layer 220. The thin film transistor 230 includes: a semiconductor layer 231, a gate electrode 232, and source and drain electrodes 233. The thin film transistor 230 can be formed using low temperature polysilicon (LTPS) that is formed using amorphous silicon formed over the second buffer layer 220 and crystallized by using laser, etc. A gate insulating layer is formed over the semiconductor layer 231. The gate electrode 232 of the thin film transistor 230 is formed over the gate insulating layer in a certain or predetermined pattern. An inter-layer insulating layer is formed over the gate electrode 232.

The source and drain electrodes 233 of the thin film transistor 230 are formed over the inter-layer insulating layer, and are electrically connected with both sides of the semiconductor layer 231, respectively, through contact holes formed in the gate insulating layer and the inter-layer insulating layer. The gate insulating layer and the inter-layer insulating layer insulate the semiconductor layer 231 from the gate electrode 232, and the gate electrode 232 from the source and drain electrodes 233.

The photo diode 240 is formed over the non-pixel region B of the second buffer layer 220. The photo diode 240, which has a structure of a P-i (intrinsic)-N, includes, in more detail: an N-type doping region 241 to which a positive voltage is applied; a P-type doping region 243 to which a negative voltage is applied; and a channel region 242 being more than 3 μm in width. Here, the P-type doping region 243 is separated from the N-type doping region 241 by the channel region 242.

In general, a photo diode, which is a sort of optical sensor for obtaining an electrical signal (current or voltage) from a light signal by converting light energy into electric energy, is a semiconductor device formed with a light detecting function at a junction part of the diode. Here, this photo diode uses a principle in that a conductivity of a diode is modulated depending on a light signal, since electrons or holes are generated by the absorption of photons. That is, the current of the photo diode is intrinsically changed according to an optical generation rate of the charge carriers, and this property converts a light signal changed as time elapses into an electrical signal, and outputs it.

The photo diode 240 composed of amorphous silicon is formed in a portion of the non-pixel region B capable of receiving external light of red-wavelength range, and the amorphous silicon is crystallized to form polycrystalline silicon with a certain or predetermined heat treatment. Thereafter, the N-type doping region 241 is formed by injecting high concentration ions of N-type impurities into a first region of the polycrystalline silicon. In the same manner, the P-type doping region 243 is formed by injecting high concentration ions of P-type impurities into a second region thereof, which is horizontally separated from the first region.

Also, the channel region 242 is formed between the N-type doping region 241 and the P-type doping region 243, as an intrinsic layer of the polycrystalline silicon into which the N-type impurities and the P-type impurities are not injected. The channel region 242 generates charges according to light incident through a surface to output them as electric energy. Here, the channel region 242 is formed to be from 3 μm to 10 μm in width. By forming the channel region 242 to be from 3 μm to 10 μm in width, the quantum efficiency of the photo diode 240 can be from 50% to 90%. In one embodiment, the channel region 242 is formed to be 3 μm in width W, since the quantum efficiency of red-wavelength range is more than 50% at this width and the opening rate of a pixel is improved by reducing junction area of the N-type doping region 241 and the P-type doping region 243. By contrast, when the channel region 242 is formed to be less than 3 μm in width W, the quantum efficiency of red-wavelength range is less than 50% so that the brightness of the organic light emitting device 260 using the photo diode 240 cannot be properly controlled. Also, when the channel region 242 is formed to be wider than 10 μm in width, the area occupied by the photo diode 240 becomes large so that the opening rate can be deteriorated.

In operation, an anode voltage ANODE is applied to the N-type doping region 241, and a cathode voltage CATHODE is applied to the P-type doping region 243. Accordingly, the channel region 242 is in a full depletion state, generates and accumulates charges by absorbing external light energy of red wavelength, that is, red wavelength from 645 nm to 700 nm, and outputs the charges as electrical signals.

The photo sensor 240 may absorb light emitted from the organic light-emitting diode 260 and convert it into electrical signals. In particular, light absorbed by the photo sensor 240, i.e., actual luminance values of the organic light-emitting diode 260, may be compared to a predetermined luminance reference value. Any deviation of the actual luminance values from the predetermined luminance reference value may be controlled by the photo sensor 240 via electrical signals, thereby facilitating constant luminance output from the organic light-emitting diode 260, i.e., light generated by the light emitting layer 262. For example, electric signals generated by the photo sensor 240 may be inputted into a comparator for comparing actual luminance values with the predetermined luminance reference value. More specifically, when the electric signal outputted from the photo sensor 240, i.e., signals representing actual luminance values, is lower than the predetermined luminance reference value, the comparator may generate a control signal to increase the luminance of light emitted by the light-emitting layer 262 of the organic light-emitting diode 260. Similarly, when the electric signal outputted from the photo sensor 240 is higher than the predetermined luminance reference value, the comparator may generate a control signal to reduce the luminance of light emitted by the light-emitting layer 262 of the organic light-emitting diode 260. Alternatively, electric signals, i.e., electric current or a voltage, generated by the photo sensor 240 with respect to an amount of light absorbed from the organic light-emitting diode 260 may be supplied to a controller, so that the controller may output a respective control signal for controlling the luminance of the light-emitting layer 262 with respect to the light emitted therefrom. Accordingly, the photo sensor 240 may maintain constant luminance of light generated in the light-emitting layer 262 of the organic light-emitting diode 260.

The planarization layer 250 is formed over the thin film transistor 230 and is made of an oxide film $SiO_2$ and/or a nitride film SiNx.

The organic light emitting device 260 is formed over the planarization layer 250, and the organic light emitting device 260 is electrically connected with the thin film transistor 230. The organic light emitting device 260 includes: a first electrode layer 261, a light emitting layer 262 and a second electrode layer 263.

The light emitting layer 262 and the second electrode layer 263 of the organic light emitting device 260 is formed over the first electrode layer 261. Also, the organic light emitting device 260 is formed over the planarization layer 250, and is electrically connected with at least one of the source electrode or the drain electrode 233 through a via hole formed so that the at least one of the source electrode or the drain electrode 233 is exposed by etching an area of the planarization layer 250. The first electrode layer 261 is made of ITO, IZO, ATO and/or ZnO. ITO, IZO, ATO and ZnO are transparent conductors.

A pixel defined layer 270, which is formed over the planarization layer 250, includes an opening part for at least partially exposing the first electrode layer 261. The pixel defined layer 270 is made of any suitable organic insulation materials such as acrylic organic compounds, polyamides, polyimides, etc.; however, it is not limited thereto.

The light emitting layer 262 of the organic light emitting device 260 is formed over the opening part for partially exposing the first electrode layer 261. The light emitting layer 262 generates light, while coupling holes and electrons (or molecules) injected from the first electrode layer 261 and the second electrode layer 263. One or more of a hole injecting layer, a hole transporting layer, an electron transporting layer, and an electron injecting layer can be provided between the first electrode layer 261 and the second electrode layer 263.

The second electrode layer 263 of the organic light emitting device 260 is formed over the light emitting layer 262 and the pixel defined layer 270. Also, in embodiments of the present invention used as a rear type light emitting structure, at least one layer of the second electrode layer 263 is made of a metal film which is a reflective film. Accordingly, the light emitted from the light emitting layer 262 is emitted to the lower substrate 200 through the first electrode layer 261 and the lower insulation film having the multi layers.

Figure 3:
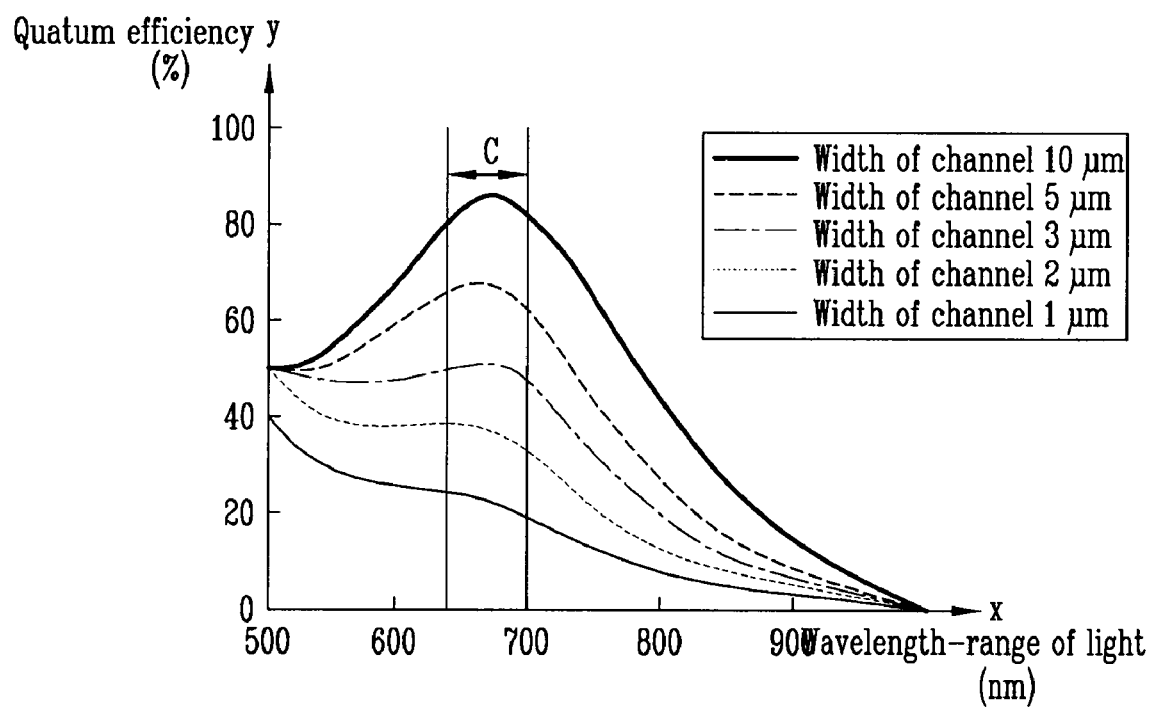
FIG. 3 is a graph showing quantum efficiency of a photo diode receiving external light of red wavelength according to a first embodiment of the present invention.

FIG. 3 is a graph showing quantum efficiency of a photo diode receiving external light of red wavelength according to a first embodiment of the present invention.

Referring to FIG. 3, the X-axis of the graph represents a wavelength range and the Y-axis represents quantum efficiency of a photo diode. In more detail, the graph shows quantum efficiency of the photo diode for receiving external light of red wavelength is dependent on the width of a channel when a first buffer layer is 3000 Å in thickness and a second buffer layer is 300 Å in thickness, the first buffer layer and the second buffer being formed in the lower part of the photo diode.

For example, when a channel is 3 μm in width in a red wavelength band C, that is, in a wavelength band from 645 nm to 700 nm, the quantum efficiency is approximately 50%. Also, when the channel is from 5 μm to 10 μm in width, the quantum efficiency is from 60% to 90%.

Accordingly, when the channel is from 3 μm to 10 μm in width W, the quantum efficiency is from 50% to 90%. By contrast, when the channel is less than 3 μm in width, the quantum efficiency is from 20% to 40%, resulting in that sufficient charges are not generated so that the brightness of the organic light emitting device using the photo diode cannot be properly controlled.

Figure 4:
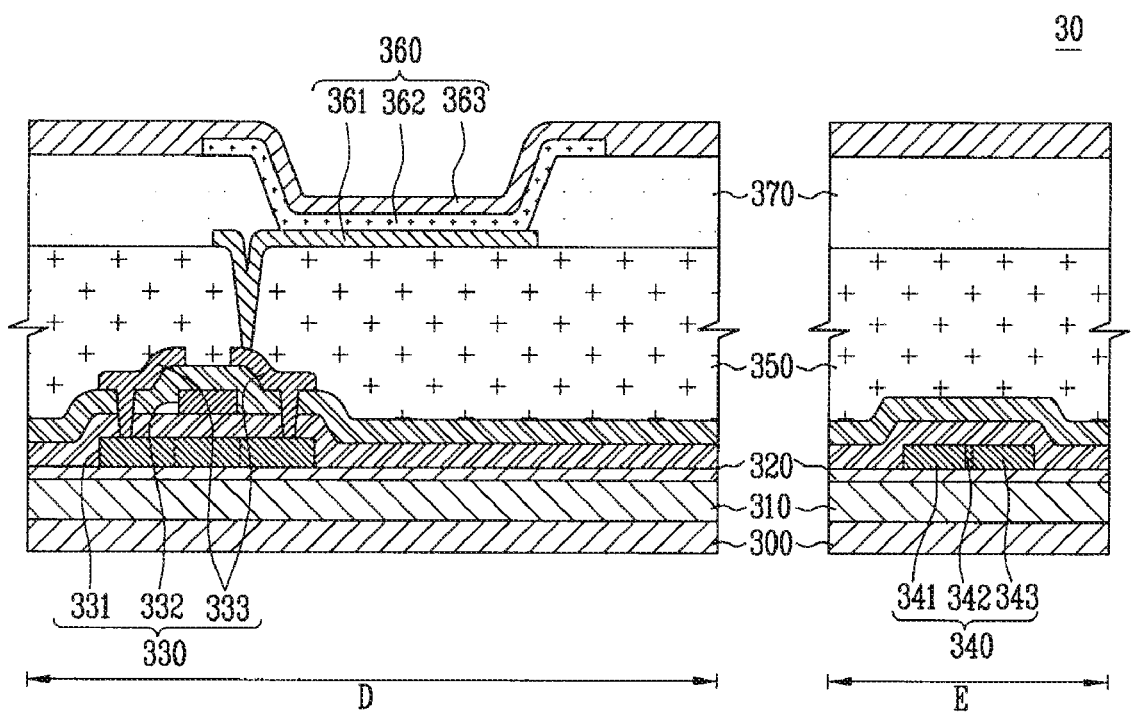
FIG. 4 is a cross-sectional view of an organic light emitting diode having a photo diode according to a second embodiment of the present invention.

FIG. 4 is a cross-sectional view of an organic light emitting diode having a photo diode according to a second embodiment of the present invention. For the convenience of explanation, elements that are substantially the same as those in the aforementioned FIG. 2 will not be described again. In particular, the description on the substrate on which the thin film transistor is formed will not be described again.

In FIG. 4, a first buffer layer 310 and a second buffer layer 320 are formed over a substrate 300. The first buffer layer 310 is made of a silicon oxide film $SiO_2$ and is formed to be from 700 Å to 900 Å in thickness, and, in one embodiment, it is formed to be 800 Å in thickness. The second buffer layer 320 is made of a silicon nitride film SiNx and is formed to be from 100 Å to 300 Å in thickness, and, in one embodiment, it is formed to be 200 Å in thickness. The thickness of the first buffer layer 310 and the thickness of the second buffer layer 320 are formed to have the above thickness ranges because these thickness ranges allow a photo diode 340 to receive the external light of red wavelength at a light receiving rate in a range from 50% to 90% or more. Here, the first buffer layer 310 and the second buffer layer 320 also reduce or prevent the diffusion of impurities while the thin film transistor 330 and the photo diode 340 are being formed to be post-processed.

In addition, a thin film transistor 330 is formed on the second buffer layer 320. The thin film transistor 330 includes: a semiconductor layer 331, a gate electrode 332, and source and drain electrodes 333.

Further, an organic light emitting device 360 is formed over a planarization layer 350, a pixel defined layer 370 is formed over the planarization layer 350 and includes an opening part for at least partially exposing a first electrode layer 361, and the organic light emitting device 360 is electrically connected with the thin film transistor 330. The organic light emitting device 360 includes: the first electrode layer 361, a light emitting layer 362 and a second electrode layer 363.

The photo diode 340 is formed over the non-pixel region E of the second buffer layer 320. The photo diode 340, which has a structure of a P-i (intrinsic)-N, includes, in more detail: an N-type doping region 341 to which a positive voltage is applied; a P-type doping region 343 to which a negative voltage is applied; and a channel region 342 being more than 4 μm in width. Here, the P-type doping region 343 is separated from the N-type doping region 341 by the channel region 342.

In general, a photo diode, which is a sort of optical sensor for obtaining an electrical signal (current or voltage) from a light signal by converting light energy into electric energy, is a semiconductor device formed with a light detecting function at a junction part of the diode. Here, this photo diode uses a principle in that a conductivity of a diode is modulated depending on a light signal, since electrons or holes are generated by the absorption of photons. That is, the current of the photo diode is intrinsically changed according to an optical generation rate of the charge carriers, and this property converts a light signal changed as time elapses into an electrical signal, and outputs it.

The photo diode 340 composed of amorphous silicon is formed in a portion of the non-pixel region E capable of receiving external light of red-wavelength range, and the amorphous silicon is crystallized to form polycrystalline silicon with a certain or predetermined heat treatment. Thereafter, the N-type doping region 341 is formed by injecting high concentration ions of N-type impurities into a first region of the polycrystalline silicon. In the same manner, the P-type doping region 343 is formed by injecting high concentration ions of P-type impurities into a second region thereof, which is horizontally separated from the first region.

Also, the channel region 342 is formed between the N-type doping region 341 and the P-type doping region 343 as an intrinsic layer of the polycrystalline silicon into which the N-type impurities and the P-type impurities are not injected. The channel region 342 generates charges according to light incident through a surface to output them as electric energy. Here, the channel region 342 is formed to be from 4 μm to 10 μm in width. By forming the channel region 342 to be from 4 μm to 10 μm in width, the quantum efficiency of the photo diode 340 can be from 50% to 90%. In one embodiment, the channel region 342 is formed to be 4 μm in width W, since the quantum efficiency of red-wavelength range is more than 50% at this width and the opening rate of a pixel is improved by reducing junction area of the N-type doping region 341 and the P-type doping region 343. By contrast, when the channel region 342 is formed to be less than 4 μm in width W, the quantum efficiency of red-wavelength range is less than 50% so that the brightness of the organic light emitting device using the photo diode 340 cannot be properly controlled. Also, when the channel region 342 is formed to be wider than 10 μm in width, the area occupied by the photo diode 340 becomes large so that the opening rate can be deteriorated.

In operation, an anode voltage ANODE is applied to the N-type doping region 341, and a cathode voltage CATHODE is applied to the P-type doping region 343. Accordingly, the channel region 342 is in a full depletion state, generates and accumulates charges by absorbing external light energy of red wavelength, that is, red wavelength from 645 nm to 700 nm, and outputs the charges as electrical signals.

The photo sensor 340 may absorb light emitted from the organic light-emitting diode 360 and convert it into electrical signals. In particular, light absorbed by the photo sensor 340, i.e., actual luminance values of the organic light-emitting diode 360, may be compared to a predetermined luminance reference value. Any deviation of the actual luminance values from the predetermined luminance reference value may be controlled by the photo sensor 340 via electrical signals, thereby facilitating constant luminance output from the organic light-emitting diode 360, i.e., light generated by the light emitting layer 362. For example, electric signals generated by the photo sensor 340 may be inputted into a comparator for comparing actual luminance values with the predetermined luminance reference value. More specifically, when the electric signal outputted from the photo sensor 340, i.e., signals representing actual luminance values, is lower than the predetermined luminance reference value, the comparator may generate a control signal to increase the luminance of light emitted by the light-emitting layer 362 of the organic light-emitting diode 360. Similarly, when the electric signal outputted from the photo sensor 340 is higher than the predetermined luminance reference value, the comparator may generate a control signal to reduce the luminance of light emitted by the light-emitting layer 362 of the organic light-emitting diode 360. Alternatively, electric signals, i.e., electric current or a voltage, generated by the photo sensor 340 with respect to an amount of light absorbed from the organic light-emitting diode 360 may be supplied to a controller, so that the controller may output a respective control signal for controlling the luminance of the light-emitting layer 362 with respect to the light emitted therefrom. Accordingly, the photo sensor 340 may maintain constant luminance of light generated in the light-emitting layer 362 of the organic light-emitting diode 360.

Figure 5:
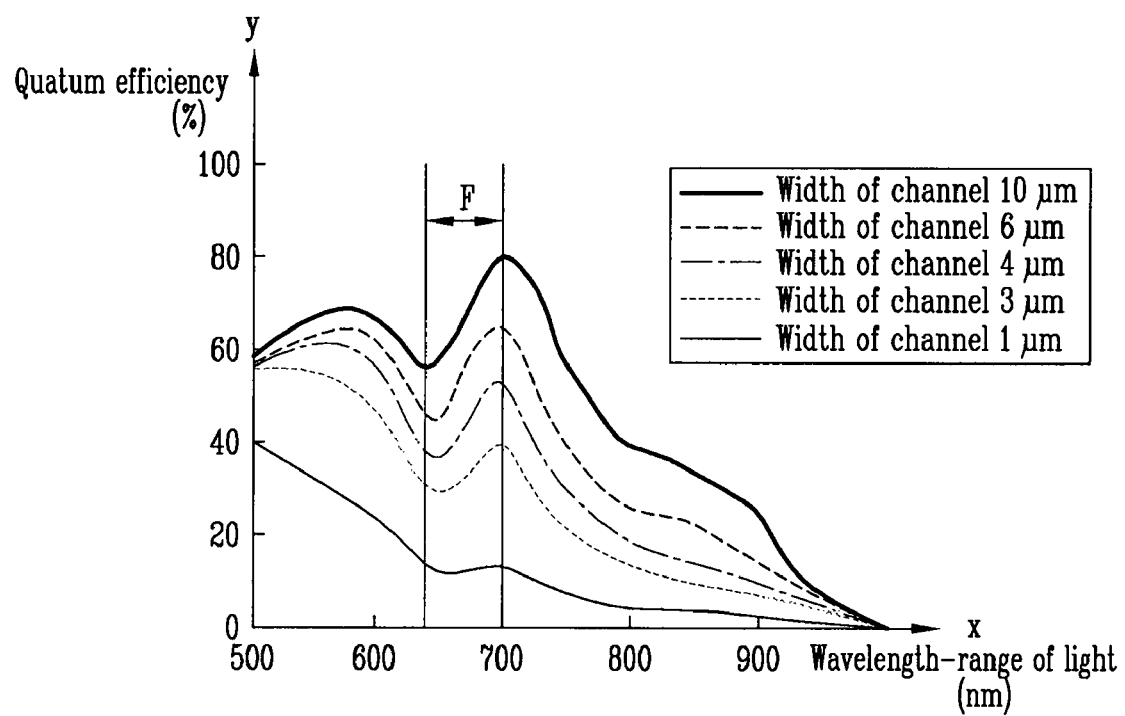
FIG. 5 is a graph showing quantum efficiency of a photo diode receiving external light of red wavelength according to a second embodiment of the present invention.

FIG. 5 is a graph showing quantum efficiency of a photo diode receiving external light of red wavelength according to a second embodiment of the present invention.

Referring to FIG. 5, the X-axis of the graph represents a wavelength range and the Y-axis represents quantum efficiency of a photo diode. In more detail, the graph shows quantum efficiency is dependent on width of a channel in red wavelength when a first buffer layer is 800 Å in thickness and a second buffer layer is 200 Å in thickness, the first buffer layer and the second buffer layer being formed in the lower part of the photo diode.

For example, when a channel is 4 μm in width in a red wavelength band F, that is, in a wavelength band from 645 nm to 700 nm, the quantum efficiency is approximately 50%. Also, when the channel is from 6 μm to 10 μm in width, the quantum efficiency is from 60% to 90%.

Accordingly, when the channel is from 4 μm to 10 μm in width W, the quantum efficiency is from 50% to 90%. By contrast, when the channel is less than 4 μm in width, the quantum efficiency is from 10% to 40%, resulting in that sufficient charges are not generated so that the brightness of the organic light emitting device using the photo diode cannot be properly controlled.

Figure 6:
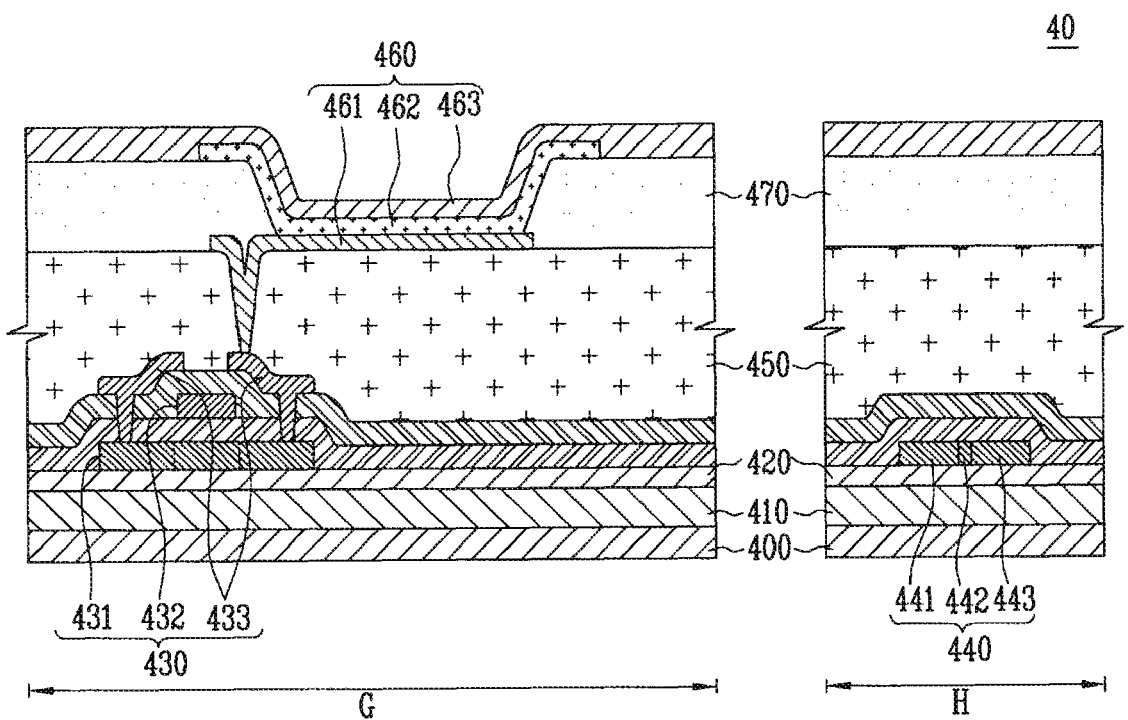
FIG. 6 is a cross-sectional view of an organic light emitting diode having a photo diode according to a third embodiment of the present invention.

FIG. 6 is a cross-sectional view of an organic light emitting diode having a photo diode according to a third embodiment of the present invention. For the convenience of explanation, elements that are substantially the same as those in the aforementioned FIG. 2 will not be described again. In particular, the description on the substrate on which the thin film transistor is formed will not be described again.

In FIG. 6, a first buffer layer 410 and a second buffer layer 420 are formed over a substrate 400. The first buffer layer 410 is made of a silicon oxide film $SiO_2$ and is formed to be from 700 Å to 900 Å in thickness, and, in one embodiment, it is formed to be 800 Å in thickness. The second buffer layer 420 is made of a silicon nitride film SiNx and is formed to be from 300 Å to 500 Å in thickness, and, in one embodiment, it is formed to be 400 Å in thickness. The thickness of the first buffer layer 410 and the thickness of the second buffer layer 420 are formed to have the above thickness ranges because these thickness ranges allow a photo diode 440 to receive the external light of red wavelength as a light receiving rate received of 50% or more. Here, the first buffer layer 410 and the second buffer layer 420 also reduce or prevent the diffusion of impurities while the thin film transistor 430 and the photo diode 440 are being formed to be post-processed.

In addition, a thin film transistor 430 is formed on the second buffer layer 420. The thin film transistor 430 includes: a semiconductor layer 431, a gate electrode 432, and source and drain electrodes 433.

Further, an organic light emitting device 460 is formed over a planarization layer 450, a pixel defined layer 470 is formed over the planarization layer 450 and includes an opening part for at least partially exposing a first electrode layer 461, and the organic light emitting device 460 is electrically connected with the thin film transistor 430. The organic light emitting device 460 includes: the first electrode layer 461, a light emitting layer 462 and a second electrode layer 463.

The photo diode 440 is formed over the non-pixel region H of the second buffer layer 420. The photo diode 440, which has a structure of a P-i (intrinsic)-N, includes, in more detail: an N-type doping region 441 to which a positive voltage is applied; a P-type doping region 443 to which a negative voltage is applied; and a channel region 442 being from 5 μm to 10 μm in width. Here, the P-type doping region is separated from the N-type doping region 441 by the channel region 442.

In general, a photo diode, which is a sort of optical sensor for obtaining an electrical signal (current or voltage) from a light signal by converting light energy into electric energy, is a semiconductor device formed with a light detecting function at a junction part of the diode. Here, this photo diode uses a principle in that a conductivity of a diode is modulated depending on a light signal, since electrons or holes are generated by the absorption of photons. That is, the current of the photo diode is intrinsically changed according to an optical generation rate of the charge carriers, and this property converts a light signal changed as time elapses into an electrical signal, and outputs it.

The photo diode 440 composed of amorphous silicon is formed in a portion of the non-pixel region H capable of receiving external light of red-wavelength range, and the amorphous silicon is crystallized to form polycrystalline silicon with a certain or predetermined heat treatment. Thereafter, the N-type doping region 441 is formed by injecting high concentration ions of N-type impurities into a first region of the polycrystalline silicon. In the same manner, the P-type doping region 443 is formed by injecting high concentration ions of P-type impurities into a second region thereof, which is horizontally separated from the first region.

Also, the channel region 442 is formed between the N-type doping region 441 and the P-type doping region 443 as an intrinsic layer of the polycrystalline silicon into which the N-type impurities and the P-type impurities are not injected. The channel region 442 generates charges according to light incident through a surface to output them as electric energy. Here, the channel region 442 is formed to be from 5 μm to 10 μm in width. By forming the channel region 442 to be from 5 μm to 10 μm in width, the quantum efficiency of the photo diode 440 can be from 50% to 90%. In one embodiment, the channel region 442 is formed to be 5 μm in width W, since the quantum efficiency of red-wavelength range is more than 50% at this width and the opening rate of a pixel is improved by reducing junction area of the N-type doping region 441 and the P-type doping region 443. By contrast, when the channel 442 is formed to be less than 5 μm in width W, the quantum efficiency of red-wavelength range is less than 50% so that the brightness of the organic light emitting device using the photo diode 440 cannot be properly controlled. Also, when the channel 442 is formed to be wider than 10 μm in width, the area occupied by the photo diode 440 becomes large so that the opening rate can be deteriorated.

In operation, an anode voltage ANODE is applied to the N-type doping region 441, and a cathode voltage CATHODE is applied to the P-type doping region 443. Accordingly, the channel 442 is in a state of full depletion, generates and accumulates charges by absorbing external light energy of red wavelength, that is, red wavelength from 645 nm to 700 nm, and outputs the charges as electrical signals.

When the brightness of the organic light emitting device 460 exceeds reference value or does not reach reference value, the electrical signals output as above control the brightness of the organic light emitting device 460 by using electrical signals output from the photo diode 440. Accordingly, the organic light emitting device 460 constantly maintains the brightness of light generated in the light emitting layer 462 and enables the organic light emitting device 460 to represent the brightness for the desired reference value.

FIG. 7 is a graph showing quantum efficiency of a photo diode receiving external light of red wavelength according to a third embodiment of the present invention.

Referring to FIG. 7, the X-axis of the graph represents a wavelength range and the Y-axis represents quantum efficiency of a photo diode. In more detail, the graph shows quantum efficiency is dependent on width of a channel in red wavelength when a first buffer layer is 800 Å in thickness and a second buffer layer is 400 Å in thickness, the first buffer layer and the second buffer layer being formed in the lower part of the photo diode.

For example, when a channel is 5 μm in width in a red wavelength band 1, that is, in a wavelength band from 645 nm to 700 nm, the quantum efficiency is approximately 50%. Also, when the channel is from 6 μm to 10 μm in width, the quantum efficiency is from 60% to 90%.

Accordingly, when the channel is from 5 μm to 10 μm in width W, the quantum efficiency is from 50% to 90%. By contrast, when the channel is less than 5 μm in width, the quantum efficiency is from 15% to 40%, resulting in that sufficient charges are not generated so that the brightness of the organic light emitting device using the photo diode cannot be controlled.

As described above, an embodiment of the present invention is to provide an organic light emitting diode, which forms a photo diode for receiving light of red wavelength incident from an external source to a non-pixel region, and for controlling the quantum efficiency of the photo diode to be from 50% to 90%. Here, the organic light emitting diode increases quantum efficiency of the photo diode by using a thickness of a buffer layer formed in the lower part of the photo diode and a width of a channel of the photo diode. Accordingly, the embodiment of the present invention controls the brightness of the organic light emitting device to be constant by using electrical signals output from the photo diode. Therefore, the embodiment of the present invention increases the lifespan of the organic light emitting diode by minimizing the change of the brightness generated due to a deterioration of the organic light emitting device after a long time of use.

Furthermore, an embodiment of the present invention can provide a high quality image in a high definition display by controlling a desired current to be flowed into an organic light emitting device provided in each pixel of the high definition display.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. An organic light emitting display device comprising:
   a substrate having a pixel region and a non-pixel region;
   a first buffer layer directly on the substrate and a second buffer layer directly on the first buffer layer;
   a thin film transistor formed over the second buffer layer;
   an organic light emitting device formed in the pixel region and electrically connected with the thin film transistor; and
   a photo diode formed in the non-pixel region directly on the second buffer layer and for receiving external light of red wavelength at a certain absorption rate,
   wherein the first buffer layer is made of a silicon oxide film and is formed to be from 2900 Å to 3100 Å in thickness, the second buffer layer is made of a silicon nitride film and is formed to be from 200 Å to 400 Å in thickness, and the photo diode comprises: an N-type doping region, a channel region being from 3 to 10 μm in width, and a P-type doping region.

2. The organic light emitting display device as claimed in claim 1, wherein the photo diode is formed in the non-pixel region and over the second buffer layer, and wherein the photo diode is spaced apart from the thin film transistor.

3. The organic light emitting display device as claimed in claim 1, wherein the photo diode comprises:
   an N-type doping region formed in the non-pixel region;
   a P-type doping region formed in the non-pixel region and separated from the N-type doping region with a certain distance therebetween; and
   a channel region formed between the N-type doping region and the P-type doping region,
   wherein the N-type doping region, the P-type doping region, and the channel region are all formed on a single plane.

4. The organic light emitting display device as claimed in claim 1, wherein the photo diode outputs a certain electrical signal depending on a quantum efficiency of red-wavelength range from the received external light of red wavelength.

5. The organic light emitting display device as claimed in claim 4, wherein the electrical signal controls the brightness of light emitted from the organic light emitting device.

6. The organic light emitting display device as claimed in claim 1, wherein the red wavelength ranges from 645 nm to 700 nm.

7. The organic light emitting display device as claimed in claim 1, wherein the photo diode is formed as an amorphous silicon layer.

8. The organic light emitting display device as claimed in claim 1, wherein the organic light emitting device is a rear type light emitting structure.

9. An organic light emitting display device comprising:
   a substrate having a pixel region and a non-pixel region;
   a first buffer layer directly on the substrate and a second buffer layer directly on the first buffer layer;
   a thin film transistor formed over the second buffer layer;
   an organic light emitting device formed in the pixel region and electrically connected with the thin film transistor; and
   a photo diode formed in the non-pixel region directly on the second buffer layer and for receiving external light of red wavelength at a certain absorption rate,
   wherein the first buffer layer is made of a silicon oxide film and is formed to be from 700 Å to 900 Å in thickness, the second buffer layer is made of a silicon nitride film and is formed to be from 100 Å to 300 Å in thickness, and the photo diode comprises: an N-type doping region, a channel region being from 4 to 10 μm in width, and a P-type doping region.

10. The organic light emitting display device as claimed in claim 9, wherein the photo diode is formed in the non-pixel region and over the second buffer layer, and wherein the photo diode is spaced apart from the thin film transistor.

11. The organic light emitting display device as claimed in claim 9, wherein the first buffer layer is made of a silicon oxide film.

12. The organic light emitting display device as claimed in claim 9, wherein the second buffer layer is made of a silicon nitride film.

13. The organic light emitting display device as claimed in claim 9, wherein the photo diode comprises:
   an N-type doping region formed in the non-pixel region;
   a P-type doping region formed in the non-pixel region and separated from the N-type doping region with a certain distance therebetween; and
   a channel region formed between the N-type doping region and the P-type doping region,
   wherein the N-type doping region, the P-type doping region, and the channel region are all formed on a single plane.

14. An organic light emitting display device comprising:
a substrate having a pixel region and a non-pixel region;
a first buffer layer directly on the substrate and a second buffer layer directly on the first buffer layer;
a thin film transistor formed over the second buffer layer;
an organic light emitting device formed in the pixel region and electrically connected with the thin film transistor; and
a photo diode formed in the non-pixel region directly on the second buffer layer and for receiving external light of red wavelength at a certain absorption rate,
wherein the first buffer layer is made of a silicon oxide film and is formed to be from 700 Å to 900 Å in thickness, the second buffer layer is made of a silicon nitride film and is formed to be from 300 Å to 500 Å in thickness, and the photo diode comprises: an N-type doping region, a channel region being from 5 μm to 10 μm in width, and a P-type doping region.

15. The organic light emitting display device as claimed in claim 14, wherein the photo diode is formed in the non-pixel region and over the second buffer layer, and wherein the photo diode is spaced apart from the thin film transistor.

16. The organic light emitting display device as claimed in claim 14, wherein the first buffer layer is made of a silicon oxide film.

17. The organic light emitting display device as claimed in claim 14, wherein the second buffer layer is made of a silicon nitride film.

18. The organic light emitting display device as claimed in claim 14, wherein the photo diode comprises:
an N-type doping region formed in the non-pixel region;
a P-type doping region formed in the non-pixel region and separated from the N-type doping region with a certain distance therebetween; and
a channel region formed between the N-type doping region and the P-type doping region, wherein the N-type doping region, the P-type doping region, and the channel region are all formed on a single plane.

* * * * *